(12) United States Patent
Chen et al.

(10) Patent No.: US 8,216,898 B2
(45) Date of Patent: Jul. 10, 2012

(54) FABRICATION METHODS FOR ELECTRONIC DEVICES WITH VIA THROUGH HOLES AND THIN FILM TRANSISTOR DEVICES

(75) Inventors: Wen-Chun Chen, Taipei (TW); Kuo-Tung Lin, Taipei (TW); Yuh-Zheng Lee, Hsinchu (TW); Chao-Feng Sung, Miaoli County (TW)

(73) Assignee: Industrial Technology Research Institute, Hsinchu (TW)

( * ) Notice: Subject to any disclaimer, the term of this patent is extended or adjusted under 35 U.S.C. 154(b) by 791 days.

(21) Appl. No.: 12/388,480

(22) Filed: Feb. 18, 2009

(65) Prior Publication Data

US 2010/0129966 A1 May 27, 2010

(30) Foreign Application Priority Data

Nov. 24, 2008 (TW) .............................. 97145337 A

(51) Int. Cl.
*H01L 51/40* (2006.01)
(52) U.S. Cl. ........ 438/256; 438/399; 438/149; 438/667; 438/629; 438/637; 257/E51.007; 257/E51.006
(58) Field of Classification Search ........... 257/E29.151, 257/E51.005, E21.411, E29.145, E29.147, 257/E29.202, E29.275, E29.273, E29.314, 257/E31.041, E49.004; 438/FOR. 201, FOR. 184, 438/629, 637–641, 667, 256, 399, 523; 349/42–43
See application file for complete search history.

(56) References Cited

U.S. PATENT DOCUMENTS

| | | | |
|---|---|---|---|
| 7,176,040 B2 | 2/2007 | Sirringhaus et al. | |
| 7,358,184 B2 | 4/2008 | Liu et al. | |
| 7,390,694 B2 * | 6/2008 | Yamamoto | 438/99 |
| 7,863,085 B2 * | 1/2011 | Lim et al. | 438/99 |
| 2003/0180979 A1 | 9/2003 | Katayama | |
| 2004/0018655 A1 | 1/2004 | Song | |
| 2005/0181582 A1 | 8/2005 | You | |
| 2006/0011995 A1 * | 1/2006 | Yamazaki et al. | 257/410 |

FOREIGN PATENT DOCUMENTS

| | | |
|---|---|---|
| TW | 587322 | 5/2004 |
| WO | WO 99/31846 | 6/1999 |

OTHER PUBLICATIONS

China Patent Office, Office Action, Patent Application Serial No. 200810185734.6, Feb. 22, 2011, China.
Taiwan Patent Office, Office Action, Application Patent Serial No. 097145337, Apr. 30, 2012, Taiwan.

* cited by examiner

*Primary Examiner* — Julio J Maldonado
*Assistant Examiner* — Mohammad Choudhry

(57) ABSTRACT

Fabrication methods for electronic devices with via through holes and thin film transistor devices are presented. The fabrication method the electronic device includes providing a substrate, forming a patterned lower electrode on the substrate, and forming a photosensitive insulating layer on the substrate covering the patterned lower electrode. A patterned optical shielding layer is applied on the photosensitive insulating layer. Exposure procedure is performed curing the exposed photosensitive insulating layer. The optical shielding layer and the underlying photosensitive insulating layer are sequentially removed, thereby forming an opening. A patterned upper electrode is formed on the photosensitive insulating layer filling the opening to create a conductive via hole.

32 Claims, 5 Drawing Sheets

FABRICATION METHODS FOR ELECTRONIC DEVICES WITH VIA THROUGH HOLES AND THIN FILM TRANSISTOR DEVICES

CROSS REFERENCE TO RELATED APPLICATIONS

This application is based upon and claims the benefit of priority from a prior Taiwanese Patent Application No. 097145337, filed on Nov. 24, 2008, the entire contents of which are incorporated herein by reference.

BACKGROUND OF THE INVENTION

1. Field of the Invention

The invention relates to fabrication methods for electronic devices, and in particular to fabrication methods for electronic devices with via through holes and thin film transistor devices.

2. Description of the Related Art

Conventionally, lithographical fabrication of electronic devices with via through holes includes alignment and exposure techniques to define via through hole patterns using a photo mask. The drawbacks of the lithographical fabrication method are that fabrication apparatus and process costs are very high. The laser drilling process for via through hole is commonly used for fabrication of semiconductor package insulation films. However, laser beams can damage the insulation film by burning nearby resin, thus resolution of laser drilling is limited to about 50 μm and fabrication cost thereof is relatively high. Meanwhile, other conventional techniques such as direct coating of conductive vias using an inkjet printing technique use no optical mask, thus reduces costs. Optical shielding patterns are inkjet printed on predetermined through hole areas, thereby achieving large scale production and being applicable to roll-to-roll processes. Advantages of roll-to-roll processes is the ability to create a drop-on-demand thin film by controlling droplets during inkjet printing, i.e., injecting droplets according to required locations as demanded.

U.S. Pat. No. 7,176,040, the entirety of which is hereby incorporated by reference, discloses a method for forming a via through hole using inkjet printing solvent thereon. Solvent is inkjet printed on the insulation layer. Openings are formed as the solvent etches the insulation layer. Conductive material is then filled into the opening to create conductive via through holes. However, the drawbacks of the abovementioned method are that diameters of the conductive via through holes are determined by surface tension of the solvent and a contact angle between the solvent and the insulation layer. The dimensions of the conductive via through holes are difficult to control. Further, the solvent may damage the underlying layers. The depth of the conductive via through holes must be controlled by the amount of injected solvent droplets. During the etching process for etching openings in the insulation layer, a coffee ring shape structure can be formed at the peripheral of the conductive via through holes, resulting in a bank with different heights. The height differences of the bank may be too high, thus detrimental to subsequent fabrication processes. The shape of the conductive via through hole can be hemispherical due to diameter differences. Additionally, high aspect ratio openings cannot be achieved by injecting solvent droplets. Thus, application of inkjet printing techniques is limited.

In summary, conventional inkjet printing methods for forming conductive via through holes have been disclosed. The depth of the conductive via through holes can be determined by controlling the amount of solvent droplets. However, the diameter, depth, and profile of the conductive via through holes are difficult to control, deteriorating process reliability. Additionally, beside precisely controlling the solvent amount and removing solvent residue, damage to underlying layer structures needed to be overcome to improve upon conventional inkjet printing methods.

BRIEF SUMMARY OF THE INVENTION

Embodiments of the invention provide a fabrication method for electronic devices with via through holes, comprising: providing a substrate; forming a patterned lower electrode on the substrate; forming a photosensitive insulating layer on the substrate covering the patterned lower electrode; applying a patterned optical shielding layer on the photosensitive insulating layer; performing an exposure procedure to cure the exposed photosensitive insulating layer; removing the optical shielding layer and the underlying photosensitive insulating layer, thereby forming an opening; and forming a patterned upper electrode on the photosensitive insulating layer filling the opening to create a conductive via hole.

Embodiments of the invention also provide a fabrication method for a thin film transistor device, comprising: providing a substrate; forming a patterned active layer on the substrate; forming a patterned first electrode on both sides of the active layer to serve as a source/drain of the thin film transistor device; forming a photosensitive insulating layer on the substrate covering the patterned first electrode and the active layer; applying a patterned optical shielding layer on the photosensitive insulating layer corresponding to the source/drain; performing an exposure procedure to cure the exposed photosensitive insulating layer; removing the optical shielding layer and the underlying photosensitive insulating layer, thereby forming an opening; forming a second electrode on the photosensitive insulating layer corresponding to the active layer to serve as a gate of the thin film transistor device; and forming a patterned third electrode on the photosensitive insulating layer filling the opening to create a conductive via hole.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

Figure 1A:
FIGS. 1A-1F are cross sections illustrating each fabrication step of an embodiment of an electronic device with conductive through holes of the invention.

It is to be understood that the following disclosure provides many different embodiments, or examples, for implementing different features of various embodiments. Specific examples of components and arrangements are described below to simplify the present disclosure. These are merely examples and are not intended to be limiting. In addition, the present disclosure may repeat reference numerals and/or letters in the various examples. This repetition is for the purpose of simplicity and clarity and does not in itself indicate a relationship between the various embodiments and/or configurations discussed. Moreover, the formation of a first feature over or on a second feature in the description that follows may include embodiments in which the first and second features are formed in direct contact or not in direct contact.

The main features and key aspects of the invention are related to fabrication methods for electronic devices with conductive through holes or via holes. The insulation layer on the substrate adopts photo sensitive materials. An optical shielding material is injected by inkjet printing on the photo sensitive material. The conductive through hole patterns can be lithographically defined in the photo sensitive material. Any electronic devices with conductive through holes, such as thin film transistors or printed circuit boards, can be applicable to embodiments of the invention, to simplify fabrication processes and to broaden application regimes.

FIGS. 1A-1F are cross sections illustrating each fabrication step of an embodiment of an electronic device with conductive through holes of the invention. Referring to FIG. 1A, a substrate 10 is provided. The substrate 10 can be a glass substrate, a silicon substrate, a plastic substrate, or a flexible soft substrate. In one embodiment of the invention, the plastic substrate can be a polyimide (PI) substrate, an epoxy glass cloth base laminated sheet (FR4), a polyethylenenaphthalate (PEN) substrate, or a polyethylene terephthalate (PET) substrate, but are not limited thereto.

Figure 1B:
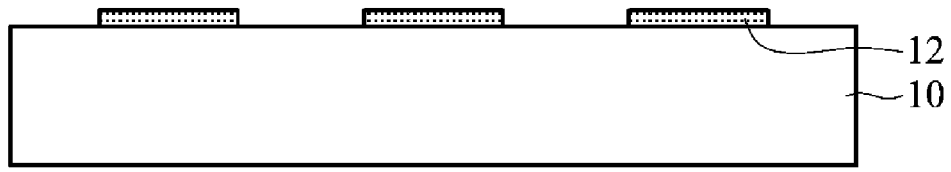

Referring to FIG. 1B, a patterned lower electrode 12 is then formed on the substrate 10. For example, a bottom electrode structure is fabricated on the substrate 10. Formation process of the lower electrode 12 includes an electroplating process, sputtering process, printing process, or any combinations thereof. The lower electrode layer can be composed of a metallic material or a solution conductive material. In one embodiment of the invention, the metallic material includes Au, Ag, Cu, Al, alloy thereof, or combinations thereof. The solution conductive material can be a poly(3,4-ethylenedioxythiophene) (PEDOT), or a nano-silver paste.

Figure 1C:
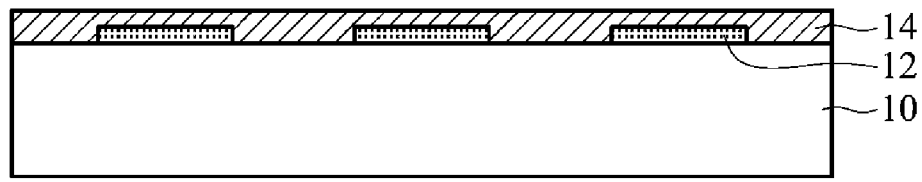

Referring to FIG. 1C, a photosensitive insulating layer 14 is then formed on the substrate 10 covering the patterned lower electrode 12. The photosensitive insulating layer 14 can optionally be a positive photoresist and a negative photoresist.

Figure 1D:
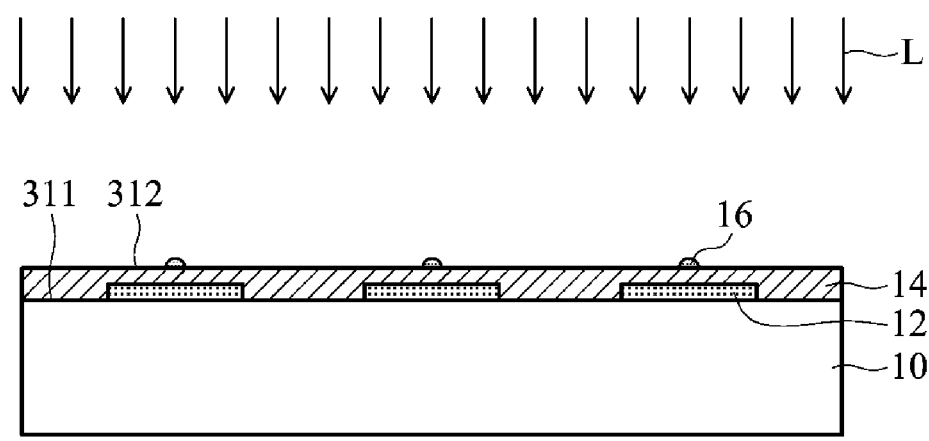

Referring to FIG. 1D, a patterned optical shielding layer 16 is applied on the photosensitive insulating layer 14. An exposure procedure L is then performed to cure the exposed photosensitive insulating layer. For example, the optical shielding layer 16 can be inkjet printed on the photosensitive insulating layer 14. The photosensitive insulating layer 14 is then exposed under UV light and cured from the second face 312 toward the first face 311. Note that the optical shielding layer is a material that blocks UV rays. More specifically, the optical shielding layer can be a silver-containing metallic layer.

Figure 1E:
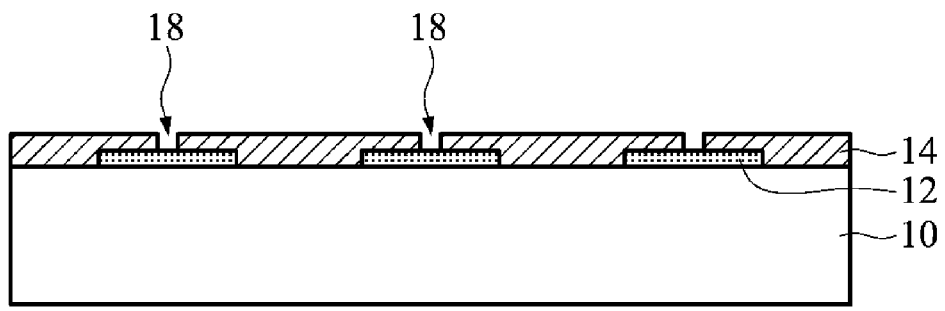
Figure 1F:
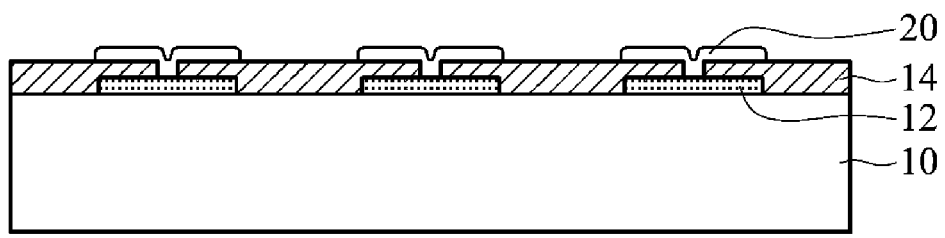

Referring to FIG. 1E, the optical shielding layer 16 and the underlying photosensitive insulating layer 14 are sequentially removed, thereby forming an opening 18. Subsequently, a patterned upper electrode 20 is formed on the photosensitive insulating layer 14 filling the opening 18 to create a conductive via through hole, as shown in FIG. 1F. In one embodiment of the invention, the upper electrode can be composed of a metallic material or a solution conductive material, wherein the metallic material comprises Au, Ag, Cu, Al, alloy thereof, or combinations thereof. Alternatively or optionally, the solution conductive material comprises a poly(3,4-ethylenedioxythiophene) (PEDOT), or a nano-silver paste.

Figure 2A:
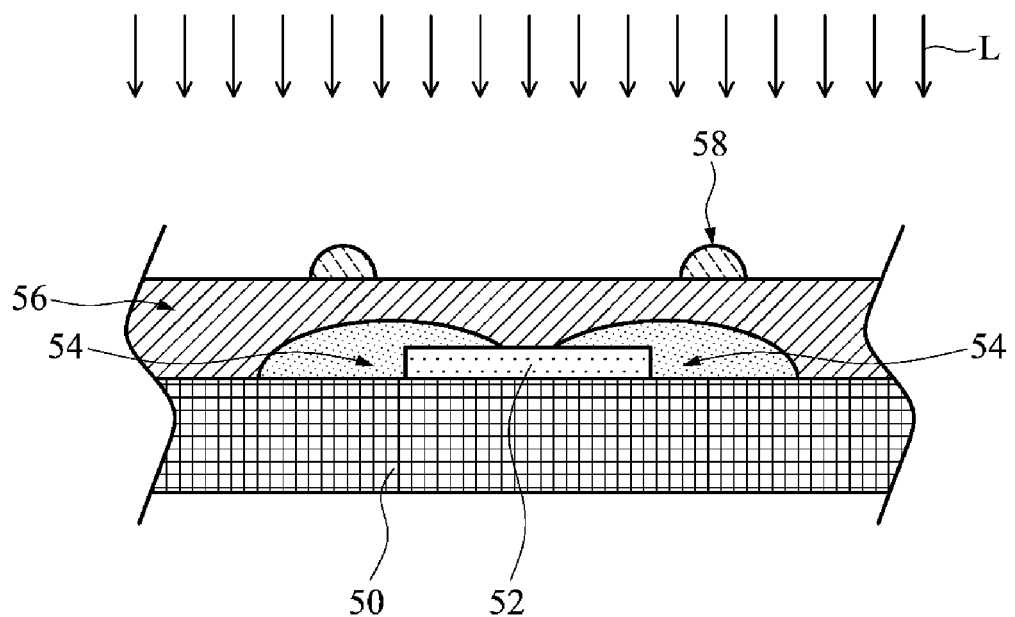
FIGS. 2A and 2B are cross sections illustrating each fabrication step of another embodiment of a thin film transistor device with conductive through holes of the invention.
Figure 2B:
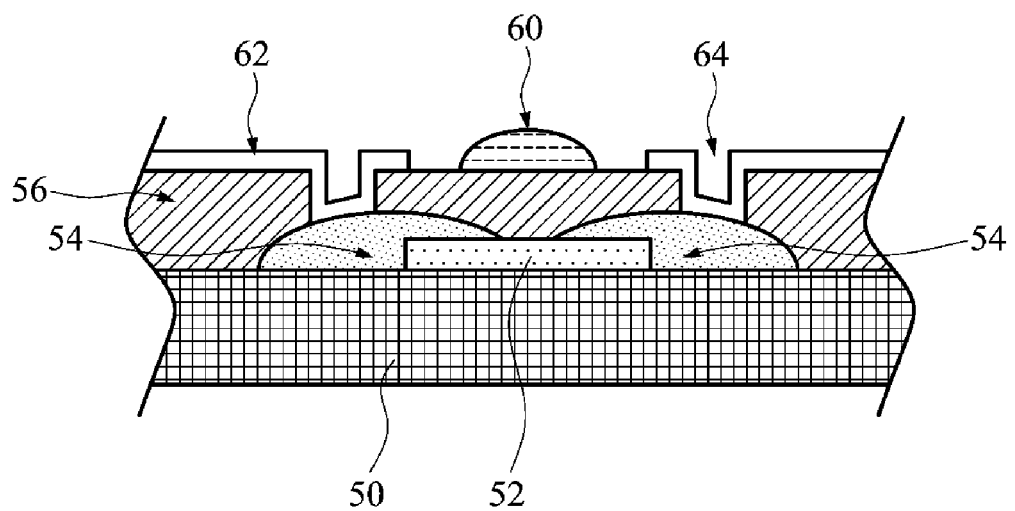

FIGS. 2A and 2B are cross sections illustrating each fabrication step of another embodiment of a thin film transistor device with conductive through holes of the invention. Referring to FIG. 2A, a substrate 50 is provides. The substrate 50 can be a glass substrate, a silicon substrate, a plastic substrate, or a flexible soft substrate. In one embodiment of the invention, the plastic substrate can be a polyimide (PI) substrate, an epoxy glass cloth base laminated sheet (FR4), a polyethylenenaphthalate (PEN) substrate, or a polyethylene terephthalate (PET) substrate, and are not limited thereto.

Next, a patterned active layer 52 is formed on the substrate 50. The active layer 52 can be an inorganic semiconductor, an oxide semiconductor, or an organic semiconductor. In one embodiment of the invention, the inorganic semiconductor includes a-Si, poly-Si, or low-temperature polysilicon (LTPS). In another embodiment, the oxide semiconductor includes ZnO or a-IGZO. Alternatively or optionally, the organic semiconductor is a P-type doped, comprising P3HT or F8T2. It should be understood that the organic semiconductor can be an N-type doped organic semiconductor, comprising a PCBM or fluorine-containing modified organic semiconductor.

Subsequently, a patterned first electrode 54 is formed on both sides of the active layer 52 to serve as a source/drain of the thin film transistor device. According to an embodiment of the invention, the lower electrode layer can be composed of a metallic material or a solution conductive material, wherein the metallic material includes Au, Ag, Cu, Al, alloy thereof, or combinations thereof. On the other hand, the solution conductive material can be a poly(3,4-ethylenedioxythiophene) (PEDOT), or a nano-silver paste.

A photosensitive insulating layer 56 is then formed on the substrate covering the patterned first electrode 54 and the active layer 52. The photosensitive insulating layer can optionally be a positive photoresist and a negative photoresist. A patterned optical shielding layer 58 is applied on the photosensitive insulating layer 56. An exposure procedure L is then performed to cure the exposed photosensitive insulating layer 56. Note that the optical shielding layer is a material that blocks UV rays. More specifically, the optical shielding layer can be a silver-containing metallic layer.

Referring to FIG. 2B, the optical shielding layer 58 and the underlying photosensitive insulating layer 56 are sequentially removed, thereby forming an opening. A second electrode 60 is subsequently formed on the photosensitive insulating layer corresponding to the active layer to serve as a gate of the thin film transistor device. Next, patterned third electrodes 62 and 64 are formed on the photosensitive insulating layer filling the opening to create a conductive via hole. Note that the second and the third electrodes can be composed of a metallic material or a solution conductive material, wherein the metallic material comprises Au, Ag, Cu, Al, alloy thereof, or combinations thereof. Alternatively or optionally, the solution conductive material comprises a poly(3,4-ethylenedioxythiophene) (PEDOT), or a nano-silver paste.

Figure 3:
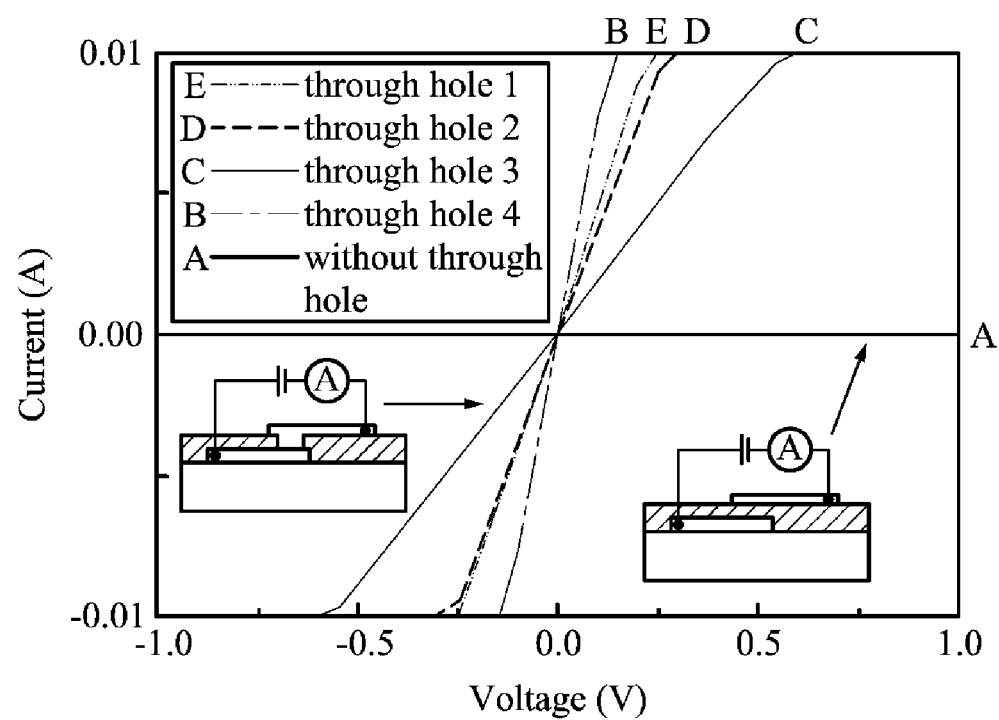
FIG. 3 schematically shows the relationship curve between current and voltage of a metal-insulator-metal (MIM) according to another embodiment of the invention.

FIG. 3 schematically shows the relationship curve between current and voltage of a metal-insulator-metal (MIM) according to another embodiment of the invention. In FIG. 3, conductive through holes are defined in the MIM structure, such as an Al-insulator-Al structure, by using inkjet printing technologies. From the I-V curves, high yield of conductive through holes can be obtained with measured resistance of approximately 50Ω such as curves B, C, D, and E. The structure without through hole cannot measure an I-V characteristic curve, as shown in curve A.

The embodiments of the invention are advantages in that a photo mask free technique is adopted. A patterned optical shielding layer serving as a mask is directly formed on the photosensitive insulating layer by using inkjet printing. The diameter of the printed optical shielding material equals to the diameter of the conductive through holes. The thickness of the photosensitive insulating layer cannot affect the diameter of the conductive through holes, thus resulting in high production yield and high reliability. Since the profile of the conductive through holes has a uniform diameter, it is advantageous for subsequent processes. Furthermore, the embodiments of the invention advantageous in that large scaled electronic devices can be fabricated using the fabrication methods of the invention, i.e., inkjet printing techniques are very suitable for roll-to-roll processes.

While the invention has been described by way of example and in terms of the several embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A fabrication method for electronic devices with via through holes, comprising:
   providing a substrate;
   forming a patterned lower electrode on the substrate;
   forming a photosensitive insulating layer on the substrate covering the patterned lower electrode;
   applying a patterned optical shielding layer on the photosensitive insulating layer;
   performing an exposure procedure to cure the exposed photosensitive insulating layer;
   removing the optical shielding layer and the underlying photosensitive insulating layer, thereby forming an opening; and
   forming a patterned upper electrode on the photosensitive insulating layer filling the opening to create a conductive via hole.

2. The fabrication method as claimed in claim 1, wherein the substrate comprises a glass substrate, a silicon substrate, a plastic substrate, or a flexible soft substrate.

3. The fabrication method as claimed in claim 2, wherein the plastic substrate comprises a polyimide (PI) substrate, an epoxy glass cloth base laminated sheet (FR4), a polyethylenenaphthalate (PEN) substrate, or a polyethylene terephthalate (PET) substrate.

4. The fabrication method as claimed in claim 1, wherein the lower electrode is composed of a metallic material or a solution conductive material.

5. The fabrication method as claimed in claim 4, wherein the metallic material comprises Au, Ag, Cu, Al, alloy thereof, or combinations thereof.

6. The fabrication method as claimed in claim 4, wherein the solution conductive material comprises a poly(3,4-ethylenedioxythiophene) (PEDOT), or a nano-silver paste.

7. The fabrication method as claimed in claim 1, wherein the photosensitive insulating layer comprises a positive photoresist and a negative photoresist.

8. The fabrication method as claimed in claim 1, wherein the optical shielding layer is a material that blocks UV rays.

9. The fabrication method as claimed in claim 8, wherein the optical shielding layer is a silver-containing metallic layer.

10. The fabrication method as claimed in claim 1, wherein the upper electrode is composed of a metallic material or a solution conductive material.

11. The fabrication method as claimed in claim 10, wherein the metallic material comprises Au, Ag, Cu, Al, alloy thereof, or combinations thereof.

12. The fabrication method as claimed in claim 10, wherein the solution conductive material comprises a poly(3,4-ethylenedioxythiophene) (PEDOT), or a nano-silver paste.

13. A fabrication method for a thin film transistor device, comprising:
   providing a substrate;
   forming a patterned active layer on the substrate;
   forming a patterned first electrode on both sides of the active layer to serve as a source/drain of the thin film transistor device;
   forming a photosensitive insulating layer on the substrate covering the patterned first electrode and the active layer;
   applying a patterned optical shielding layer on the photosensitive insulating layer corresponding to the source/drain;
   performing an exposure procedure to cure the exposed photosensitive insulating layer;
   removing the optical shielding layer and the underlying photosensitive insulating layer, thereby forming an opening;
   forming a second electrode on the photosensitive insulating layer corresponding to the active layer to serve as a gate of the thin film transistor device; and
   forming a patterned third electrode on the photosensitive insulating layer filling the opening to create a conductive via hole.

14. The fabrication method as claimed in claim 13, wherein the substrate comprises a glass substrate, a silicon substrate, a plastic substrate, or a flexible soft substrate.

15. The fabrication method as claimed in claim 14, wherein the plastic substrate comprises a polyimide (PI) substrate, an epoxy glass cloth base laminated sheet (FR4), a polyethylenenaphthalate (PEN) substrate, or a polyethylene terephthalate (PET) substrate.

16. The fabrication method as claimed in claim 13, wherein the active layer comprises an inorganic semiconductor, an oxide semiconductor, or an organic semiconductor.

17. The fabrication method as claimed in claim 16, wherein the inorganic semiconductor comprises a-Si, poly-Si, or low-temperature polysilicon (LTPS).

18. The fabrication method as claimed in claim 16, wherein the oxide semiconductor is ZnO or a-IGZO.

19. The fabrication method as claimed in claim 16, wherein the organic semiconductor is a P-type doped, comprising P3HT or F8T2.

20. The fabrication method as claimed in claim 16, wherein the organic semiconductor is an N-type doped, comprising PCBM or fluorine-containing modified organic semiconductor.

21. The fabrication method as claimed in claim 13, wherein the first electrode is composed of a metallic material or a solution conductive material.

22. The fabrication method as claimed in claim 21, wherein the metallic material comprises Au, Ag, Cu, Al, alloy thereof, or combinations thereof.

23. The fabrication method as claimed in claim 21, wherein the solution conductive material comprises a poly(3,4-ethylenedioxythiophene) (PEDOT), or a nano-silver paste.

24. The fabrication method as claimed in claim 13, wherein the second electrode is composed of a metallic material or a solution conductive material.

25. The fabrication method as claimed in claim 24, wherein the metallic material comprises Au, Ag, Cu, Al, alloy thereof, or combinations thereof.

26. The fabrication method as claimed in claim 24, wherein the solution conductive material comprises a poly(3,4-ethylenedioxythiophene) (PEDOT), or a nano-silver paste.

27. The fabrication method as claimed in claim 13, wherein the photosensitive insulating layer comprises a positive photoresist and a negative photoresist.

28. The fabrication method as claimed in claim 13, wherein the optical shielding layer is a material that blocks UV rays.

29. The fabrication method as claimed in claim 28, wherein the optical shielding layer is a silver-containing metallic layer.

30. The fabrication method as claimed in claim 13, wherein the third electrode is composed of a metallic material or a solution conductive material.

31. The fabrication method as claimed in claim 30, wherein the metallic material comprises Au, Ag, Cu, Al, alloy thereof, or combinations thereof.

32. The fabrication method as claimed in claim 30, wherein the solution conductive material comprises a poly(3,4-ethylenedioxythiophene) (PEDOT), or a nano-silver paste.

* * * * *